United States Patent [19]

Kimura et al.

[11] Patent Number: 4,874,721
[45] Date of Patent: Oct. 17, 1989

[54] METHOD OF MANUFACTURING A MULTICHIP PACKAGE WITH INCREASED ADHESIVE STRENGTH

[75] Inventors: Mitsuru Kimura; Shoji Nakakita, both of Tokyo, Japan

[73] Assignee: NEC Corporation, Tokyo, Japan

[21] Appl. No.: 259,319

[22] Filed: Oct. 18, 1988

Related U.S. Application Data

[60] Division of Ser. No. 180,697, Apr. 8, 1988, abandoned, which is a continuation of Ser. No. 928,559, Nov. 10, 1986, abandoned.

[30] Foreign Application Priority Data

Nov. 11, 1985 [JP] Japan ................................ 60-250.652
Nov. 11, 1985 [JP] Japan ................................ 60-250653
Nov. 22, 1985 [JP] Japan ................................ 60-261483

[51] Int. Cl.$^4$ ............................................. H01L 21/60
[52] U.S. Cl. ..................................... 437/209; 29/830; 29/847; 174/52.4; 361/412
[58] Field of Search ............... 174/52 FP, 52 R, 50.6, 174/50.52; 437/209; 29/830, 829, 831, 832, 847

[56] References Cited

U.S. PATENT DOCUMENTS

| | | | |
|---|---|---|---|
| 3,340,438 | 9/1967 | Dion et al. ......................... | 174/50.6 |
| 3,436,818 | 4/1969 | Merrin et al. ...................... | 174/52 FP |
| 3,968,193 | 7/1976 | Langston, Jr. et al. ............... | 264/61 |
| 4,157,932 | 6/1979 | Hirata ............................. | 29/830 |
| 4,221,047 | 9/1980 | Narken et al. ...................... | 29/840 |
| 4,231,154 | 11/1980 | Gazdik et al. ...................... | 29/840 |
| 4,446,477 | 5/1984 | Currie et al. ....................... | 357/74 |
| 4,616,655 | 10/1986 | Weinberg et al. .................... | 357/80 |
| 4,649,417 | 3/1987 | Burgess et al. ...................... | 357/80 |
| 4,685,033 | 8/1987 | Inoue ................................ | 29/829 |
| 4,698,662 | 10/1987 | Young et al. ....................... | 357/80 |
| 4,721,831 | 1/1988 | Vora ................................. | 29/830 |
| 4,736,521 | 4/1988 | Dohya ............................... | 437/209 |
| 4,744,007 | 5/1988 | Watari et al. ....................... | 361/386 |

FOREIGN PATENT DOCUMENTS

0193051 5/1981 Japan .
0202540 of 1983 Japan .
0212030 of 1986 Japan .
1361400 of 1974 United Kingdom ................. 437/209

OTHER PUBLICATIONS

"Copper/Polyimide Materials System for High Performance Packaging", Jensen et al., 0569-5503/84/0000/0073, 1984, IEEE, pp. 73–81.
"The Thin Film Module as a High Performance Semiconductor Package", Ho et al., IBM J. Res. DEVELOP., vol. 26, No. 3, pp. 286–296, (May 1982).

Primary Examiner—Brian E. Hearn
Assistant Examiner—Beverly A. Pawlikowski
Attorney, Agent, or Firm—Burns, Doane, Swecker & Mathis

[57] ABSTRACT

A method for manufacturing a multichip package including the steps of forming a first polyimide insulating layer on a surface of a ceramic multilayer substrate having a circuit wiring therein, forming a first wiring connected to the circuit wiring of the multilayer substrate with a part of the first wiring being exposed at an open surface of the first polyimide insulating layer, forming a second polyimide insulating layer on a surface of a semiconductor element, and forming a second wiring connected with a circuit wiring of the semiconductor element in the second polyimide insulating layer with a part of the second wiring being exposed at an open surface of the second polyimide insulating layer. The method also includes positioning the semiconductor element on the substrate such that the part of the first wiring and the part of the second wiring oppose each other, and applying a predetermined pressure and a predetermined temperature in a predetermined gas atmosphere for a predetermined time period to cause the first and second polyimide layers to be cured and bonded with each other and to cause the parts of first and second wirings to be adhered to each other by thermal bonding.

2 Claims, 3 Drawing Sheets 4,874,721

METHOD OF MANUFACTURING A MULTICHIP PACKAGE WITH INCREASED ADHESIVE STRENGTH

This application is a divisional of application Ser. No. 180,697 filed Apr. 8, 1988, which is a continuation of Ser. No. 928,559, filed Nov. 10, 1986 both are abandoned.

BACKGROUND OF THE INVENTION

The present invention relates to a multichip package.

Conventionally, in manufacturing multichip packages, a wire bonding method or a TAB (Tape Automatic Bonding) method is utilized to mount and connect ICs on a ceramic substrate on which a polyimide insulating film is formed (COPPER/POLYIMIDE MATERIALS SYSTEM FOR HIGH PERFORMANCE PACKAGING, 0569-5503/84/0000-0073 1984 IEEE). Also, a soldering method is utilized (The Thin-Film Module as a High-Performance Semiconductor Package, IBM J. RES. DEVELOP. VOL. 26, NO. 3 May 1982).

In the above conventional wire bonding or TAB connection method, since lead terminals extend outwardly from the outer sides of an IC or LSI chip, packaging efficiency is degraded. In addition, since thermal bonding or ultrasonic welding is utilized, the polyimide insulating film on the surface of the ceramic substrate is deformed or damaged, degrading the reliability. Furthermore, with the soldering connection method, the size of the connection pad or connection bump cannot be suppressed to about 50 μm, and high-density packaging cannot thus be performed.

SUMMARY OF THE INVENTION

A multichip package according to the present invention comprises a ceramic multilayer substrate having a multilayer circuit wiring therein, input/output pins connected to a lower surface of the multilayer substrate, a first polyimide insulating layer formed on an upper surface of the multilayer substrate, a first vertical wiring formed on an uppermost layer of the first polyimide insulating layer, and a plurality of semiconductor elements each having a second polyimide insulating layer and a second vertical wiring which are connected to the first polyimide insulating layer and the first vertical wiring, respectively.

DETAILED DESCRIPTION OF THE PREFERRED EMBODIMENTS

The present invention will be described with reference to the accompanying drawings.

Figure 1:
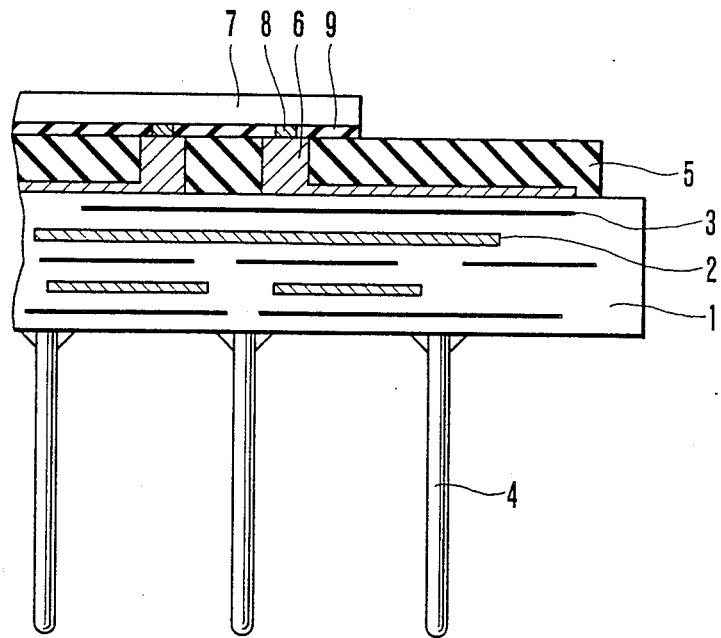
FIG. 1 is a schematic sectional view showing a first embodiment of the present invention.

FIG. 1 shows a multichip package according to an embodiment of the present invention. Referring to FIG. 1, a ceramic multilayer substrate 1 is a multilayer circuit substrate comprising an alumina ceramic including a tungsten (W) or molybdenum (Mo) power source wiring pattern 2 and a gold (Au) or silver-palladium (Ag/Pd) signal wiring pattern 3. Input/output pins 4 of a koval material or the like are connected to the lower surface of the multilayer substrate 1 by a silver-copper eutectic alloy. A polyimide insulating layer 5 is formed on the upper surface of the multilayer substrate 1. A plurality of vertical wirings 6 connected to the power source and signal patterns 2 and 3 are formed in the polyimide insulating layer 5 such that the surfaces thereof are planar with an upper surface of the polyimide insulating layer 5.

A polyimide insulating layer 9 is formed on the lower surface of each of a plurality of integrated circuit chips 7. Vertical wirings 8 are formed in the polyimide insulating layer 9 such that the lower surfaces thereof are planar with the lower surface of the polyimide insulating layer 9. The upper surface of the polyimide insulating layer 5 is directly bonded to the lower surface of the polyimide insulating layer 9, and the upper surfaces of the vertical wirings 6 are directly bonded to the respective lower surfaces of the vertical wirings 8. Each vertical wiring 8 formed on the lower surface of each integrated circuit chip 7 is made of gold (Au) and is a square with a side of 20 to 30 μm. The polyimide insulating layer 9 is a polyimide resin at an intermediate stage (anti-cure state) of dehydration cyclopolymerization before it is bonded. Similarly, each wiring 6 at the ceramic multilayer substrate 1 side is made of gold (Au) and is square with a side of 20 to 30 μm. The uppermost layer of the polyimide insulating layer 5 is in an anti-cure state before it is bonded. The polyimide insulating layers 9 and the vertical wirings 8 at the integrated circuit chip 7 side are caused to oppose the polyimide insulating layer 5 and the vertical wirings 6 at the ceramic multilayer circuit substrate 1 side, respectively, and are bonded with each other in an $N_2$ atmosphere at a pressure of about 2 kg/mm$^2$ and a temperature of about 400° C. for about 1 hour. As a result, the polyimide insulating layers 5 and 9 are completely cured and bonded with each other, and the vertical wirings 6 and 8 are subjected to gold (Au)-gold (Au) thermal bonding and adhered to each other. In this case, unlike in the wire bonding or TAB method, since no pressure is locally applied and the polyimide insulating layers 9 on the surfaces of the integrated circuit chips 7 are abutted against the polyimide insulating layer 5 of the ceramic multilayer substrate 1, no deformation or breakdown occurs in the insulating layers 5 and 9.

Figure 2:
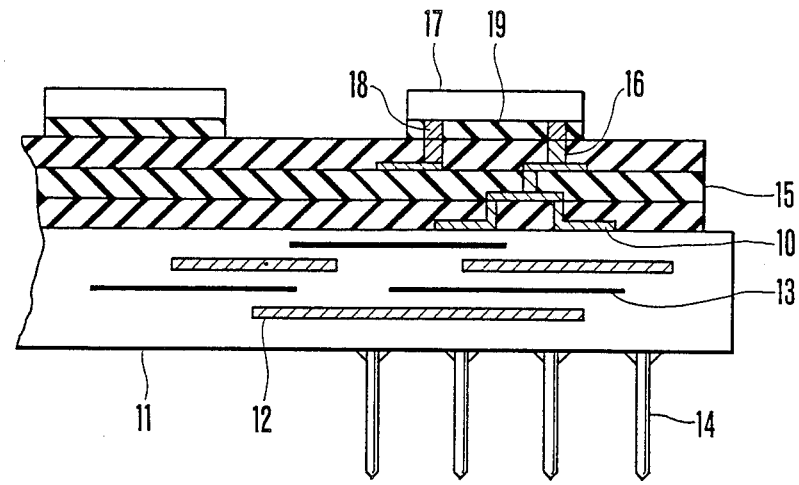
FIG. 2 is a schematic sectional view showing a second embodiment of the present invention.

FIG. 2 shows another embodiment of the present invention. Referring to FIG. 2, a ceramic multilayer substrate 11 incorporates a power source wiring pattern 12 and a signal wiring pattern 13, and input/output pins 14 and a polyimide insulating layer 15 are formed on the upper and lower surface of the ceramic multilayer substrate 11, respectively, in a similar manner so that in the embodiment shown in FIG. 1. The insulating layer 15 is a multilayer and wiring patterns 10 are formed to extend between the respective layer of the insulating layer 15. The wiring patterns 10 of the respective layers of the insulating layer 15 are connected with each other through via holes formed in the respective layers of the insulating layer 15 as needed. The uppermost wiring pattern 10 is connected to an integrated circuit chip 17 through vertical wirings 16 and 18 in a similar manner to that in FIG. 1.

Figure 3:
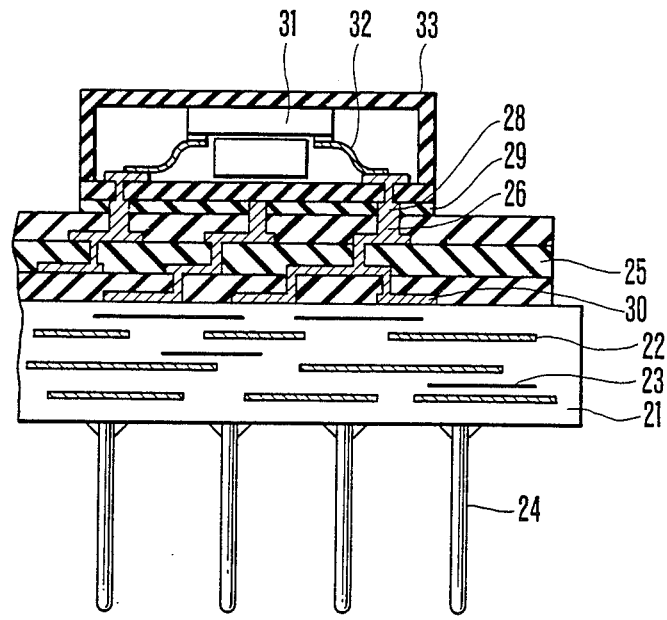
FIG. 3 is a schematic sectional view showing a third embodiment of the present invention.

FIG. 3 shows still another embodiment of the present invention wherein a chip carrier 33 is mounted on a structure similar to that of FIG. 2, instead of an integrated circuit chip 17. Each of a plurality of chip carriers 33 incorporates an IC chip 31 and leads 32. The leads 32 connect the IC chip 31 with vertical wirings 28 provided in a polyimide insulating layer 29 in a similar manner to the vertical wirings 18 of FIG. 2. The chip carriers 33 are bonded on the upper surface of an insulating layer 29 in a similar bonding mechanism to in the case of integrated circuit chips. In this case, if an IC chip 31 of any chip carrier 33 is to be replaced or tested, the chip carrier 33 can be easily removed. Therefore, the ceramic multilayer substrate portion having a wiring pattern and the chip carrier 33 can be tested independently.

As described above, according to the present invention, a polyimide insulating layer and a vertical wiring on a ceramic multilayer substrate having a multilayer circuit wiring are directly bonded to a polyimide insulating layer and a vertical wiring on an integrated circuit chip or chip carrier to oppose each other. As a result, since connection can be made with a small size of about 50 μm or less, packaging density can be increased and a highly reliable multichip package can be obtained.

What is claimed is:

1. A method for manufacturing a multichip package comprising the steps of:

forming a first polyimide insulating layer on a surface of a ceramic multilayer substrate having a circuit wiring therein;

forming a first wiring connected to said circuit wiring of said multilayer substrate with a part of said first wiring being exposed at an open surface of said first polyimide insulating layer;

forming a second polyimide insulating layer on a surface of a semiconductor element;

forming a second wiring connected with a circuit wiring of said semiconductor element in said second polyimide insulating layer with a part of said second wiring being exposed at an open surface of said second polyimide insulating layer;

positioning said semiconductor element on said substrate such that said part of said first wiring and said part of said second wiring oppose to each other; and applying a predetermined pressure and a predetermined temperature in a predetermined gas atmosphere for a predetermined time period to cause said first and second polyimide insulating layers to be cured and bonded with each other and to cause the parts of said first and second wiring to be connected to each other by thermocompression bonding.

2. A method accoding to claim 1, wherein said first and second wiring are made of gold, respectively, and bonded to each other by gold-to-gold thermocompression bonding.

* * * * *